United States Patent [19]
Gray et al.

[11] Patent Number: 4,587,442
[45] Date of Patent: May 6, 1986

[54] CURRENT THRESHOLD DETECTOR
[75] Inventors: Randall C. Gray, Scottsdale, Ariz.; Eric D. Joseph, Yorba Linda, Calif.
[73] Assignee: Motorola, Inc., Schaumburg, Ill.
[21] Appl. No.: 557,025
[22] Filed: Dec. 1, 1983
[51] Int. Cl.[4] .................. H03K 5/153; G01R 19/165; G01R 19/175
[52] U.S. Cl. .................... 307/350; 307/354; 307/362
[58] Field of Search ............ 307/350, 354, 362; 330/258

[56] References Cited
U.S. PATENT DOCUMENTS
4,378,529 3/1983 Dobkin .................. 330/258

Primary Examiner—John Zazworsky
Attorney, Agent, or Firm—Michael D. Bingham

[57] ABSTRACT

A circuit for detecting a very large output current threshold with respect to a flow reference current. The threshold detector circuit includes a multiple transistor circuit wherein a pair of emitter areas are ratioed with respect to each other, and which have common bases, and an error amplifier the inputs of which are connected to the respective emitters of the multiple transistor circuit. An output current is sourced from the emitter of the multiple transistor circuit having the larger area which output current is a function of the load coupled therewith to thereby produce a voltage at this emitter the magnitude thereof being a function of the output current. The current sourced from the other emitter of the multiple transistor circuit to the additional input of the error amplifier is proportional to the bias current sourced therefrom by the error amplifier whereby the error amplifier effectfully monitors the emitter voltages of the multiple transistor circuit to provide an error signal the sense of which switches as the output load current varies above and below a threshold value that is a function of the magnitude of the reference current.

9 Claims, 3 Drawing Figures

CURRENT THRESHOLD DETECTOR

BACKGROUND OF THE INVENTION

The present invention relates to circuitry for detecting a current threshold level, and more particularly, to a circuit wherein a very large output current threshold is detected with respect to a low current reference signal.

There are many applications which utilize a current threshold detector circuit. For example, a current detection circuit may be utilized as a current regulator to provide an output current the magnitude of which is maintained at a predetermined level. Thus, if the output current should vary, it is sensed or detected by the current threshold detector to provide a feedback signal to increase or decrease the output current accordingly.

There are other prior art systems in which the safe operation thereof can be exceeded if the level of operating current exceeds a certain threshold level. For instance, DC motor controlled circuits are used in many applications for providing predescribed operations such as automatic window control for automobiles among other things. It is possible that the load current supplied to the motor could, under extreme conditions, exceed the ratings of the motor. If this were to happen, the motor could be damaged or even destroyed. To prevent the foregoing from occurring, prior art systems have required detection means whereby the level of the load current is detected. If the current level exceeds a predetermined threshold level an error output signal is produced which may set a latch circuit to shutdown the motor until such time that the load current therethrough becomes less than the threshold level.

Typically, prior art detection schemes require the use of a sense resistor in the high load current path (through the motor for instance). The load current produces a voltage to be developed across a sense resistor which is monitored by an operational amplifier. The output of the operational amplifier is caused to be switched as the level of the current causes the input of the operational amplifier to switch which activates a latch circuit to shut off the load until such time that the load current is reduced to below the predetermined threshold level.

A serious disadvantage of such prior art detection schemes is that the sense resistor is placed in the high load current path which causes excessive power to be dissipated in the resistor. If the sense resistor is fabricated as a part of an integrated detector circuit, this power dissipation provides undesirable heating of the integrated circuit chip. Moreover, any power dissipated in the sense resistor reduces the available power to the load which also may be undesirable.

Hence, there exists a need for a current threshold detector circuit which overcomes the disadvantage of the prior art schemes as described above.

SUMMARY OF THE INVENTION

Accordingly, it is an object of the present invention to provide an improved current threshold detector circuit.

Another object of the invention is to provide a current threshold detector wherein a very large output current threshold is detected with respect to a low current reference signal.

Still another object of the invention is to provide a monolithic current detector circuit wherein the threshold trip point of an output current is made a function of an internal reference current of the current detection circuit.

A further object of the present invention is to provide a current threshold detector circuit which detects an output current level while minimizing voltage drops in the output current loop.

In accordance with the above and other objects, there is provided a circuit for detecting a threshold level of an output current sourced therefrom comprising multiple transistor circuit means for supplying first and second proportional currents, the first current being a function of a reference bias current sourced from the transistor circuit means and the second current being a function of the output current wherein the first and second output currents produce voltage levels at first and second outputs which are proportional to the magnitude of the current source therefrom; and an error amplifier means having inputs coupled to the outputs of the multiple transistor circuit means which monitors the respective voltage levels supplied thereto for producing an error signal at the output of the current threshold detector circuit, wherein the sense of the error signal switches as the output current varies above and below a predetermined threshold level wherein the magnitude of the threshold level is made a function of the reference bias current sourced by the error amplifier means.

DETAILED DESCRIPTION OF THE PREFERRED EMBODIMENT

Figure 1:
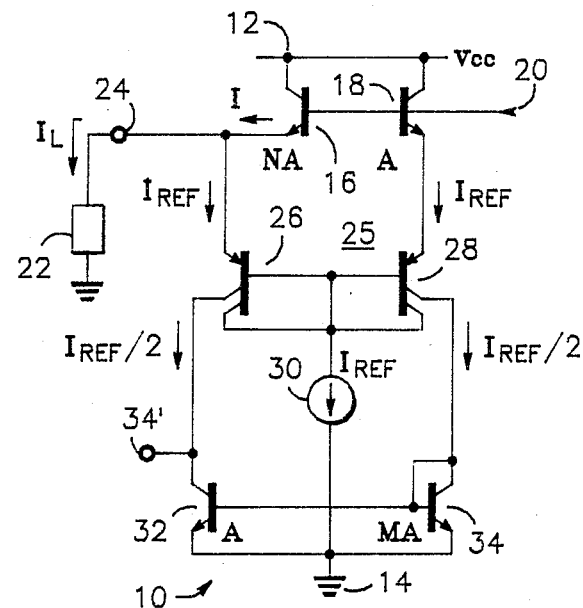
FIG. 1 is a schematic diagram illustrating the basic current threshold detector circuit of the present invention.

Turning to FIG. 1 there is shown current threshold detector 10 of the present invention. Detector 10 is suited to be manufactured in monolithic integrated circuit form and receives a power supply voltage $V_{CC}$ across power supply conductors 12 and 14. NPN transistor 16 and 18 form a transistor circuit means for establishing a difference voltage between the respective emitters (first electrodes) thereof relative to the commonly connected base (control) electrodes. This difference voltage, as will be later described, is a function of the load current $I_L$ supplied to load means 22 at terminal 24. The base electrodes of transistor 16 and 18 are biased at 20 by a driving circuit (not shown) which may, for example, be comprised of a PNP transistor having its collector-emitter path connected to node 20 and operated in a saturated state as is understood.

The voltage appearing at the respective emitters of transistors 16 and 18 are monitored at the inputs of error amplifier 25 which inputs correspond to the emitters of multi-collector PNP transistors 26 and 28. Error amplifier 25 is in the form of an operational amplifier having a differential-to-single ended output. Transistors 26 and 28 have their respective base electrodes commonly coupled to reference current source 30. Current source 30 is also coupled to respective collectors of transistors 26 and 28. Additional collectors of these two transistors are coupled in series with the respective collectors of NPN transistors 32 and 34 which form the differentialto-single ended output circuit of the operational amplifier. The output of error amplifier 25 is taken at 34'.

As illustrated, transistor 16 has an emitter area that is N times the emitter area of transistor 18: where N is any positive number. Likewise, in the general case, the emitter of diode connected transistor 34 is indicated as having an area that is M times greater than the emitter area of transistor 32: M being any positive number.

In operation, detector 10 produces an error signal at output 34' the sense of which is a function of the magnitude of the load current $I_L$. If the magnitude of $I_L$ is less than a predetermined threshold value, the sense of the error signal is positive in that current is sourced from error amplifier 25 to output 34'. Conversely, if $I_L$ is greater than the threshold value, error amplifier 25 would tend to cause current to be sunk at output 34': a negative sense of the error signal. At balance or at the trip point of detector 10, wherein the magnitude of $I_L$ is equal to the threshold value, the error signal is neither sourced nor sunk at output 34'.

The manner in which detector 10 produces an error signal is now described. For explanation purposes, detector 10 will be assumed to be in a balanced state. Further, it is assumed that the area ratio factor, M, is equal to 1 whereby transistors 32 and 34 are matched devices. At balance, the emitter voltages of transistor 16 and 18, which form a multiple transistor circuit means, are at equal potential respective to the base electrodes thereof. In this state, transistor 18 sources the current $I_{REF}$ required by current source 30 to the emitter of transistor 28 which is one input to error amplifier 25. The current $I_{REF}$ produces a base-emitter voltage drop across transistor 18 which is also developed across the base-emitter of transistor 16. Thus, a current I flows from the emitter of the latter device which, in the balanced state, is equal to:

$$I = N \times I_{REF} \qquad (1)$$

Because transistors 26 and 28 are also matched devices, at balance, these transistors will conduct the same current since their respective emitters are at the same potential and their respective bases are commonly connected. Hence, a current $I_{REF}$ is also sourced through transistor 26 from transistor 16. Further, at balance, the load current is equal to a value:

$$I_L = I - I_{REF}, \text{ and} \qquad (2)$$

$$I_L = I_{REF}(N-1) \qquad (3)$$

The threshold level of the load current at which detector 10 changes states is therefore a function of the reference bias current $I_{REF}$. If, for example, $I_{REF}$ is programmable, any desired threshold level can be set by user of the present invention.

Continuing, if the collector areas of transistors 26 and 28 are equal, a current $I_{REF}/2$ will flow from each. The current flowing from the collector of transistor 28 is sunk by diode connected transistor 34. Therefore transistor 32 will be forced to sink a current of equal magnitude which is sourced from transistor 26. Therefore, as all of the available current flowing from transistor 26 is sunk by transistor 32, error current is neither sourced nor sunk at output 34'.

Although the sum of the respective currents flowing into the emitters of transistors 26 and 28 is equal to $2I_{REF}$, the ratio of these two currents is a function of the load current $I_L$ sourced through load means 22. For instance, at a value of $I_L$ less than the threshold value of equation 3, i.e., $I_L$ less than the value of $I_{REF}(N-1)$, the voltage at the emitter of transistor 26 will be greater than the voltage at the emitter of transistor 28. Transistor 26 therefore conducts harder than transistor 28. Therefore most of the total sum of the reference bias current that is sourced by current source 30 is supplied by transistor 26. Because, the devices are matched, the collector current flowing from transistor 26 to transistor 32 will be greater than sourced from transistor 28 to transistor 34. Hence, due to the current mirror action of transistor 34 and 32, an excess current is available at output 34'.

Correspondingly, if $I_L$ becomes greater than the threshold value, the voltage at the emitter of transistor 28 becomes more positive than the voltage at the emitter of transistor 26. Transistor 28 then conducts harder than transistor 26 which produces collector currents flowing from the former that are greater than the collector currents flowing from the latter. Transistor 32 will then be in a saturated condition wherein the net current flow at output 34' is negative, i.e., current would tend to flow into the output.

As previously mentioned, detector 10 may be utilized in one application as a current threshold detector. In this application the load current can be detected with respect to the reference current to produce an output signal at output 34' whenever the load current exceeds a predetermined threshold value to indicate, for example, an overload condition. The error signal or overload indicating signal can then be utilized to shut down or reduce the current through the load. For instance, load 22 may be a motor and the output 34' can be used to drive a logic control circuit which controls the conduction of the current flowing through the motor. As the motor current exceeds the threshold value, the control circuit can be activated to shut down the motor in order to protect it.

Another application for detector circuit 10 may be as a current regulator circuit. In this application, output 34' could be coupled back to node 20 to provide control of the biasing of transistor 16 and 18. Hence, if $I_L$ is too low, the error signal flowing from output 34' is utilized to increase the bias on the bases of transistor 16 and 18 to increase $I_L$ until the balanced state is reached. The opposite would be true if the value of $I_L$ exceeds the balanced state condition, i.e., the bias of transistor 16 and 18 can be reduced as the sense of the error signal is changed whereby $I_L$ is then reduced.

At the trip point, the value of $I_L$ required is a function of the area ratioing of the emitters of transistors 32 and 34. By changing this area ratio, by making the area of transistor 34 greater than transistor 32 (M greater than 1), the value of $I_L$ is forced to increase to trip error amplifier 25 for a given $I_{REF}$. Thus, a larger load current can be detected with respect to a given $I_{REF}$ by simply area rationing the emitters of the two described transistors with respect to one another.

A feature of the present invention is that a very large load or output current can be detected with respect to a very low current bias. In addition, as previously mentioned, the current bias source 30 can be made programmable such that a user can vary the value of $I_L$ at balance or at the threshold trip point level to fit his needs. Thus, by either internally or externally programming $I_{REF}$, the balance state or trip point of current detector 10 varies as a function thereof.

Figure 2:
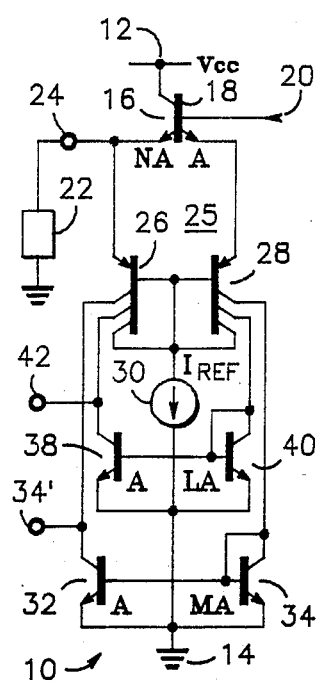
FIG. 2 is a schematic diagram illustrating a second embodiment of the present invention.
Figure 3:
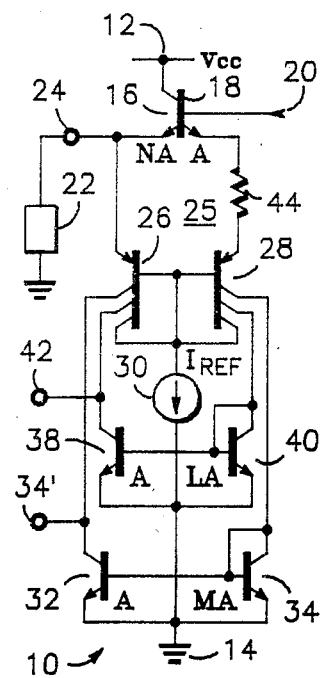
FIG. 3 is a schematic diagram illustrating a third embodiment of the present invention.

Referring to FIGS. 2 and 3, detector 10 can be expanded to detect more than one trip point, each having a different value with respect to each other if so desired. In this embodiment, additional collectors are added to multiple collector transistors 26 and 28 which are connected to an additional current mirror or differential-to-single ended circuit comprising transistors 38 and 40 in the same manner as described above with respect to transistors 32 and 34. This additional circuitry operates in the same manner as aforedescribed to produce an output error signal at output 42 as the value of $I_L$ exceeds a threshold level that is a function of $I_{REF}$ times the area scaling of transistors 40 and 38, in this case the emitter area of transistor 40 is shown as being L times greater than the emitter area of transistor 38. Hence, if the value of L and M were equal, the threshold trip point at outputs 34' and 42 would be the same. However, by making the ratios of L and M different, the outputs 34' and 42 switch at different values of $I_L$ accordingly. It should be understood, that one could also area ratio the collectors of multiple collector transistors 26 and 28 with respect to each other and to each device. This collector ratioing produces the same effect as changing either the value of $I_{REF}$ or the ratio factors L and M as previously described.

In addition, transistors 16 and 18 are illustrated as being a multi-emitter device. Because the base electrodes of transistor 16 and 18 are common, they can be formed in the same base diffusion region during the manufacturing process of detector circuit 10 as is well understood.

Turning to FIG. 3 there is shown expanded detector circuit 10 of FIG. 2 which is modified to include resistor 44 connected between the emitters of transistors 18 and 28. The presence of resistor 44 develops a delta voltage drop between transistor 18 and transistor 28 to produce the same effect on the circuit as changing the ratio factor N. If, for instance, a very large output current $I_L$ threshold is to be detected and $I_{REF}$ is made very small, the value of N required to satisfy the conditions of equations (1) through (3) may become too large to realize transistor 16. Thus, if $I_{REF}$ is fixed, the value of N is effectively raised by the addition of resistor 44. This allows the size of transistor 16 to be no larger than necessary while minimizing the size of transistor 18. Besides this feature, a significant advantage of the embodiment of the present invention is that detector circuit 10 can detect very large current thresholds while minimizing heat losses since other than transistor 16 there is no power dissipation in the high output current, $I_L$, path. Thus, not only is power dissipation minimized in the integrated circuit of the present invention to prevent heat problems, the available power to a load is maximized.

Thus, what has been described above is novel detector circuit which, among other functions, finds application as either a current threshold detector or current regulator. The detector circuit detects very large output current thresholds with respect to a very low internal current reference source.

We claim:

1. Detector circuit for sensing when the magnitude of an output current sourced therefrom varies above and below a predetermined current threshold level, comprising:
   transistor circuit means for sourcing first and second currents at first and second outputs which establish first and second voltages the magnitudes of which are a function of said first and second currents and which vary inversely with respect to each other as the output current varies, said first output being coupled to an output of the detector; and
   error amplifier means which monitors said first and second voltages for producing an error signal at an output the sense of said error signal being caused to change as the output current varies above and below the current threshold level, said error amplifier means including a current source for sinking a substantially constant reference current, the magnitude of which is fixed and comprises said first and second currents, the ratio of said first and second currents comprising said reference current being a function of the difference between said magnitudes of said first and second voltages.

2. The detector of claim 1 wherein said error amplifier means includes:
   first and second multiple collector transistors each having base electrodes commonly coupled to said current source, a first collector connected with the base thereof and emitter electrodes respectively coupled to said first and second outputs of said transistor circuit means; and
   a differential-to-single ended output circuit for coupling a second collector of each one of said first and second multiple collector transistors to said output of said error amplifier.

3. The detector of claim 2 wherein said transistor circuit means, includes first and second transistors each having a first electrode coupled to a first power supply conductor at which is supplied a source of operating potential, control electrodes commonly connected to a terminal at which a bias signal is supplied, and second electrodes connected respectively to said first and second outputs.

4. The detector of claim 3 wherein said differential-to-single ended output circuit includes first and second transistors each having an emitter connected in common to a second power supply conductor, commonly connected bases, and a collector, said collector of said first transistor of said differential-to-single ended output circuit being coupled to said second collector of said first multiple collector transistor and said collector of said second transistor being coupled both to said output of the error amplifier means and said second collector of said second multiple collector transistor.

5. The detector of claim 4 wherein said first transistor of said differential-to-single ended output circuit has an emitter area that is M times larger than the area of said emitter of second transistor thereof, where M is any positive number.

6. The detector of claim 5 wherein said first, second and control electrodes of said first and second transistors of said transistor circuit means being emitter, collector and base electrodes respectively and said emitter area of said second transistor is N times larger than the emitter area of said first transistor, where N is any positive number.

7. The detector of claim 2 wherein said transistor circuit means comprises a multiple emitter transistor having first and second emitters coupled respectively to said first and second outputs, a base which receives a bias signal and a collector which is coupled to a first power supply conductor, said second emitter having an area N times larger than the area of said first emitter where N is any positive number.

8. The detector of claim 7 wherein said error amplifier means includes an additional differential-to-single ended output circuit for coupling a third collector of each one of said first and second multiple collector transistors to a second output of said error amplifier means.

9. The detector of claim 8 including a resistor which is coupled between said first output of said transistor circuit means and said emitter of said first multiple collector transistor.

* * * * *